(12) United States Patent
Jiroku

(10) Patent No.: US 7,804,096 B2
(45) Date of Patent: Sep. 28, 2010

(54) SEMICONDUCTOR DEVICE COMPRISING PLANARIZED LIGHT-SHIELDING ISLAND FILMS FOR THIN-FILM TRANSISTORS

(75) Inventor: Hiroaki Jiroku, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 597 days.

(21) Appl. No.: 11/296,386

(22) Filed: Dec. 8, 2005

(65) Prior Publication Data

US 2006/0163583 A1    Jul. 27, 2006

(30) Foreign Application Priority Data

Jan. 21, 2005    (JP)    ............... 2005-014510

(51) Int. Cl.
  *G02F 1/1335* (2006.01)
  *H01L 29/786* (2006.01)
(52) U.S. Cl. ................ 257/72; 257/E29.282; 349/110; 349/111
(58) Field of Classification Search ............... 257/59, 257/72, E29.282, E33.065; 349/110, 111
See application file for complete search history.

(56) References Cited

U.S. PATENT DOCUMENTS 4,984,033 A * 1/1991 Ishizu et al. ............ 257/98
6,661,025 B2 12/2003 Hirabayashi
6,809,338 B2 * 10/2004 Murade ............... 257/72
6,909,118 B2 6/2005 Hara
7,317,205 B2 1/2008 Yamazaki et al.

FOREIGN PATENT DOCUMENTS

| JP | A 11-194360 | 7/1999 |
|---|---|---|
| JP | A-2000-77668 | 3/2000 |
| JP | A-2000-294791 | 10/2000 |
| JP | A 2002-100778 | 4/2002 |
| JP | A-2003-186421 | 7/2003 |
| JP | A-2004-343018 | 12/2004 |

* cited by examiner

*Primary Examiner*—Lynne A Gurley
*Assistant Examiner*—Andrew O Arena
(74) *Attorney, Agent, or Firm*—Oliff & Berridge, PLC

(57) ABSTRACT

A semiconductor device includes: a substrate; a plurality of island-shaped light shielding films formed on the substrate; a first insulating film formed between the plurality of light shielding films; a second insulating film formed on the first insulating film and the plurality of light shielding films; and semiconductor elements each having a semiconductor film. The step difference is not generated between an interface between the first insulating film and the second insulating film and an interface between each of the plurality of light shielding films and the second insulating film. Each of the plurality of light shielding films is disposed between each of the semiconductor films and the substrate.

7 Claims, 6 Drawing Sheets

SEMICONDUCTOR DEVICE COMPRISING PLANARIZED LIGHT-SHIELDING ISLAND FILMS FOR THIN-FILM TRANSISTORS

BACKGROUND

1. Technical Field

The present invention relates to a semiconductor device, to a liquid crystal device, to an electronic apparatus, and to a method of manufacturing the semiconductor device.

2. Related Art

There has been known a light valve used for a video projector, an image sensor, and an active-matrix liquid crystal display device which use an active-matrix substrate, which is obtained by forming active elements such as thin film semiconductor devices for driving pixels on an insulating substrate made of quartz, glass, or the like.

Projection light is incident on a thin film semiconductor device used in a light valve, however, when the projection light is directly or indirectly incident on a semiconductor film which becomes a channel forming region of the thin film semiconductor device, photo leakage current is generated in the region due to a photoelectric effect. As a result, the characteristics of the thin film semiconductor device are deteriorated. Further, when light is incident on the periphery of a pixel region, there is a possibility that the light is reflected from metal wiring lines or the like, and accordingly, the circuit pattern of the periphery of the pixel region is projected to be displayed.

In order to prevent the above-mentioned problems, JP-A-11-194360 discloses a method of preventing light from being incident on a semiconductor film or a region around the periphery of a pixel by forming a light shielding film between a substrate and a semiconductor film.

However, if the light shielding film is formed on a substrate, a step difference between a surface of the substrate and a surface of the light shielding film is generated as shown in FIG. 6 of JP-A-11-194360. Therefore, when an insulating film and a semiconductor film are laminated thereon, a surface of the insulating film and a surface of the semiconductor film are not flat.

If a thin film semiconductor device is formed by using such a semiconductor film, an element having the step difference in a channel forming region and an element having a flat channel forming region are generated. A semiconductor element having the step difference in the channel forming region is different from a semiconductor element having the flat semiconductor film in the thickness of the semiconductor film, the thickness of the gate insulating film, an electric field effect, etc. Therefore, the electrical characteristics of the semiconductor element having the step difference in the channel forming region is different from those of the semiconductor element having the flat semiconductor film. For this reason, variations of the electrical characteristics occur among a plurality of semiconductor elements formed on the same substrate.

Further, if the semiconductor film is not formed in a flat manner, when the semiconductor film is melted by a thermal process, the material of the semiconductor film flows downward. Thereby, the thickness of the semiconductor film becomes inconsistent, which makes a thinner part of the semiconductor film easily damaged. Further, in the configuration having the step difference, when the light valve or the like is manufactured by using the semiconductor device, there is a possibility that the characteristics, such as the optical transmittance, are degraded.

SUMMARY

An advantage of some aspects of the invention is that it provides a semiconductor device including a semiconductor element of which electrical characteristics are improved by forming a semiconductor film substantially flat.

In order to achieve the above-mentioned advantage, according to an aspect of the invention, a semiconductor device includes: a substrate; a plurality of island-shaped light shielding films formed on the substrate; a first insulating film formed between the plurality of light shielding films; a second insulating film formed on the first insulating film and the plurality of light shielding films; and semiconductor elements each having a semiconductor film. The step difference is not generated between an interface between the first insulating film and the second insulating film and an interface between each of the plurality of light shielding films and the second insulating film. Each of the plurality of light shielding films is disposed between each of the semiconductor films and the substrate.

According to the above-mentioned configuration, since the step difference between the substrate and each of the plurality of light shielding films is eliminated by the insulating film provided to fill between the plurality of island-shaped light shielding films, the step difference is hardly generated between the interface between the first insulating film and the second insulating film and the interface between each of the plurality of light shielding films and the second insulating film. As a result, the semiconductor film formed thereabove can be made approximately flat, so that it is possible to improve the electrical characteristics of the semiconductor element.

In the semiconductor device according to the aspect of the invention, preferably, the first insulating film is in contact with the substrate.

Further, in the semiconductor device according to the aspect of the invention, preferably, each of the plurality of light shielding films absorbs or reflects at least a part of light that is incident on the semiconductor film through the substrate. With this configuration, it is possible to prevent photo leakage current from being generated in the semiconductor film due to a photoelectric effect.

Furthermore, in the semiconductor device according to the aspect of the invention, preferably, each of the plurality of light shielding films is formed so as to cover the entire semiconductor film. With this configuration, since the light shielding film is used, it is possible to prevent projection light or reflected light from being incident on the entire semiconductor film and to prevent the photo leakage current from being generated due to the photoelectric effect.

Furthermore, depending on a material of the light shielding film or a method of manufacturing the light shielding film, there is a case in which cracks are easily generated in the light shielding film. In this case, it is preferable that each of the light shielding films be formed so as to cover at least a channel forming region of the semiconductor film. With this configuration, it is possible to effectively prevent the photoelectric effect from occurring.

According to another aspect of the invention, a liquid crystal device and an electronic apparatus each include the semiconductor device according to the aspect of the invention. They are high-performance electro-optical device and high-performance electronic apparatus, respectively, each having a semiconductor device with excellent properties obtained by forming a flat semiconductor film.

According to still another aspect of the invention, a method of manufacturing a semiconductor device includes: forming a plurality of island-shaped light shielding films on a substrate, by forming a light shielding film on the substrate, then forming a plurality of island-shaped etching masks on the corresponding light shielding films, respectively, and then etching the corresponding light shielding films until a corresponding surface of the substrate is exposed through the corresponding etching masks; forming a first insulating film on the exposed surface of the substrate and the etching masks; removing the etching masks; forming a second insulating film on the plurality of light shielding films and the first insulating film; and forming semiconductor elements above the light shielding films with the second insulating film interposed therebetween.

According to the manufacturing method, since the light shielding films are formed in an island shape and then the first insulating film is formed so as to fill between the light shielding films, the step difference between each of the light shielding films and the first insulating film is eliminated and the surfaces of the light shielding films and the substrate become flat. As a result, the semiconductor films formed thereabove can also be formed without any step difference.

Further, according to still another aspect of the invention, a method of manufacturing a semiconductor device includes: forming a first insulating film on a substrate; forming an etching mask on the first insulating film, the etching mask having a plurality of island-shaped openings; forming a plurality of grooves by etching the first insulating film through the etching mask; forming a plurality of light shielding films on the plurality of island-shaped grooves and removing the etching mask; forming a second insulating film on the plurality of light shielding films and the first insulating film; and forming semiconductor elements above the light shielding films with the second insulating film interposed therebetween.

According to the manufacturing method, since the surfaces of the insulating film and the light shielding films can be formed to be substantially flat by filling the light shielding films into the grooves formed in the insulating film, the semiconductor films formed thereabove can also be formed without any step difference.

Further, in the manufacturing method according to the aspect of the invention, it is preferable that surfaces of the first insulating film and the light shielding films be planarized before forming the second insulating film. In this case, it is possible to form the insulating film and the semiconductor films to be even more flat.

Furthermore, according to the method according to the aspect of the invention, the step difference is not generated in the insulating film or the semiconductor films formed on the light shielding film. Therefore, even when a thermal process, that is, a process of melting and crystallizing the semiconductor films by irradiating a laser beam thereonto is performed, the material of the semiconductor films does not flow downward. As a result, it is possible to obtain, as a semiconductor film, a polycrystalline silicon film having a good crystallinity and little defects, which improves the electrical characteristics of the semiconductor element.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings.

Figure 1:
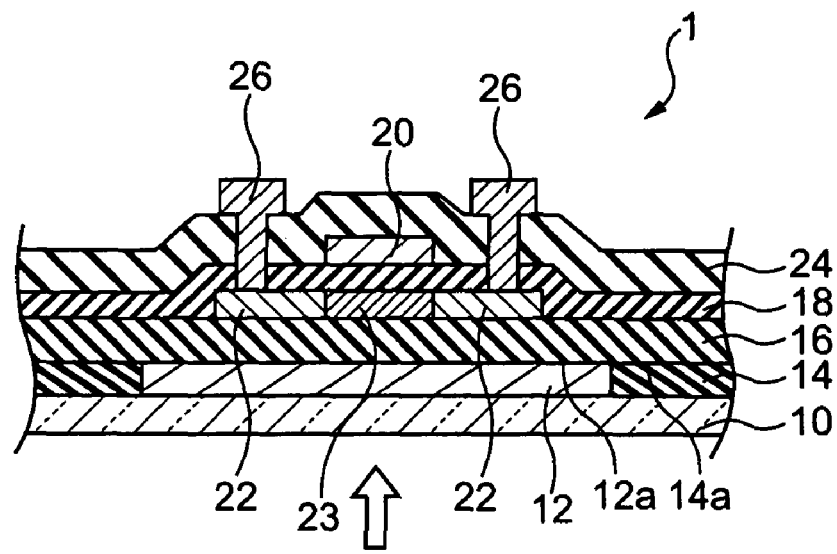
FIG. 1 is a cross-sectional view illustrating a semiconductor device according to an embodiment of the invention.

FIG. 1 is a cross-sectional view of a semiconductor element in a semiconductor device according to a first embodiment of the invention. In this embodiment, an active-matrix-type transmissive liquid crystal display device in which a thin film transistor (TFT) 1 serving as a semiconductor element is arranged on a substrate will be described as an example.

As shown in FIG. 1, the TFT 1 is formed on a substrate 10. On the substrate 10, a light shielding film 12 is formed in an island shape so as to prevent light from being incident on a semiconductor film of the TFT 1, the light being irradiated from below (direction shown by an arrow in FIG. 1). FIG. 1 illustrates one of the semiconductor elements included in the semiconductor device according to the invention. The light shielding film 12 is formed in an island shape so as to correspond to each TFT of the semiconductor device according to the invention. Further, a first insulating film is formed around the periphery of the light shielding film 12 so as to fill between the light shielding film 12 and each of the other light shielding films corresponding to TFTs other than the TFT 1, and a second insulating film 16 is formed on the light shielding film 12 and the first insulating film 14. Between an interface 14a between the first insulating film 14 and the second insulating film 16 and an interface 12a between the light shielding film 12 and the second insulating film 16, there is hardly a step difference, and surfaces of the light shielding film 12 and the first insulating film 14 are formed on approximately the same plane.

As the substrate 10, a substrate made of, for example, quartz, glass, silicon, or the like can be used, but it is preferable to use a quartz substrate having high transmittance.

The TFT 1 includes a semiconductor film composed of a source/drain region 22 and a channel forming region 23, an insulating film 18 composed of a silicon oxide film staked on the semiconductor film, a gate electrode 20 formed on the insulating film 18, an insulating film 24 formed so as to cover the insulating film 18 and the gate electrode 20, and a source/drain electrode 24 formed in a contact hole passing through the insulating films 18 and 24. The TFT 1 is disposed on the substrate 10 with the insulating film 16 interposed therebetween.

The light shielding film 12 is disposed between the semiconductor film and the substrate 10.

In the present embodiment, since the area of the light shielding film 12 is larger than that of the TFT 1, it is possible to prevent light from being incident on the entire semiconductor film. The light shielding film 12 can be formed of, for example, a metal, such as Ti, Cr, W, Ta, Mo, and Pd, or a metal alloy, such as metal silicide.

Figure 2:
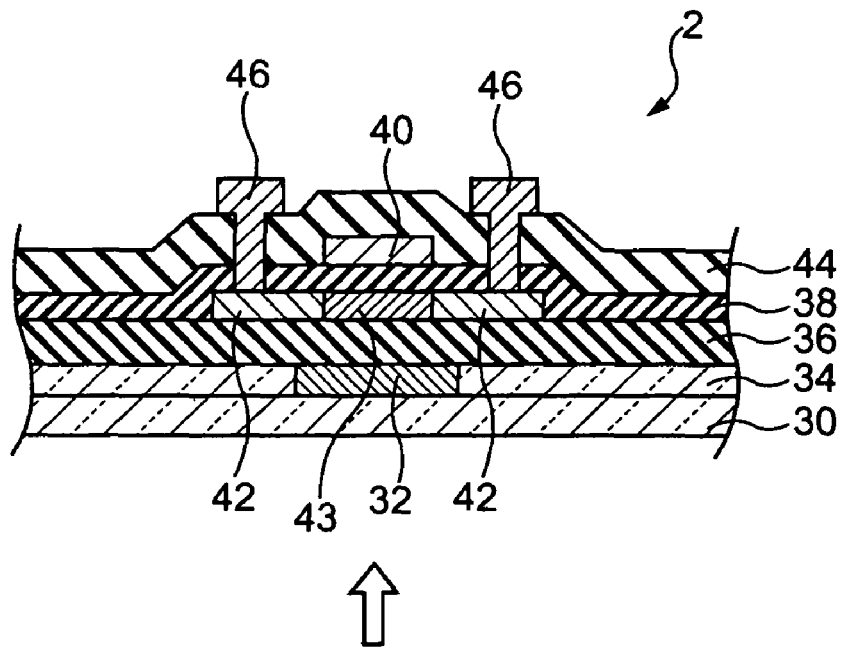
FIG. 2 is a cross-sectional view illustrating another semiconductor device according to the embodiment of the invention.

FIG. 2 is a cross-sectional view of the semiconductor element in a semiconductor device according to a second embodiment of the invention. This embodiment is the same as the above-mentioned first embodiment, except that the area of a light shielding film 32 is slightly larger than that of a channel forming region 43 of a semiconductor film of a TFT 2 and is not larger than the area of the semiconductor film.

In this embodiment, although light is incident on a part of the semiconductor film, it is possible to prevent the light from being incident on the channel forming region 43, so that it is possible to prevent photo leakage current from being generated due to a photoelectric effect. If the area of a light shielding film is large, cracks are easy to be generated depending on a material of the light shielding film. Therefore, in this case, the above-mentioned configuration is advantageous in which only the channel forming region 43 is shielded from light.

Next, a method of manufacturing a semiconductor device according to the invention will be described. Since substantially the same manufacturing method can be used in the first and second embodiments, the method will be described by using the same reference numerals as in the first embodiment for convenience.

Formation of Light Shielding Film and Insulating Film

Figure 3A:
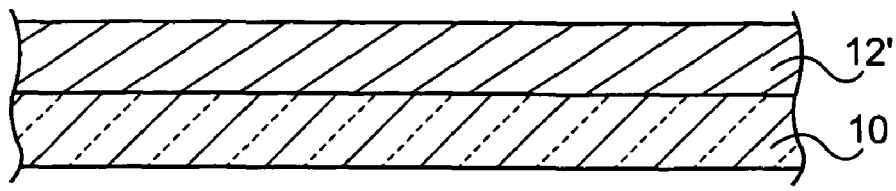
FIGS. 3A to 3E are views illustrating a method of manufacturing a semiconductor device according to the embodiment of the invention.

First, as shown in FIG. 3A, a light shielding film 12' is formed on a substrate 10. As the light shielding film 12', it is possible to use a film made of a metal, such as Ti, Cr, W, Ta, Mo, and Pd, or a film made of a metal alloy film, such as metal silicide, which is formed by a sputtering method or the like. The thickness of the light shielding film 12' is not particularly limited. For example, the thickness of the light shielding film 12' may be in a range of 100 to 500 nm.

Figure 3B:
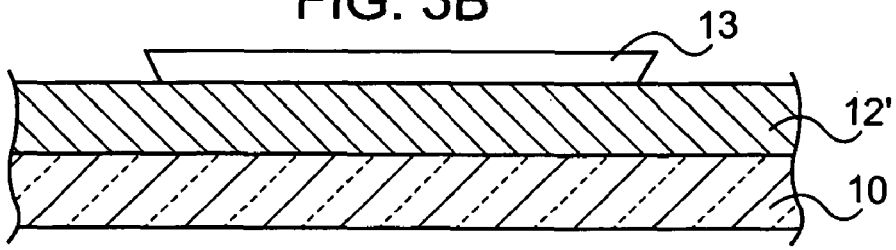
Figure 3C:
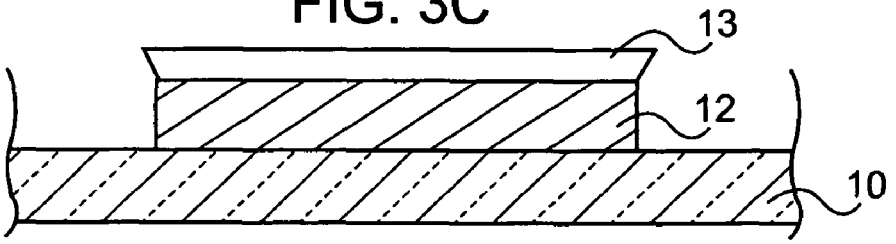

Then, as shown in FIG. 3B, a photoresist film 13 serving as an etching mask is formed on only a part of the light shielding film 12', only the part being remained as a light shielding film 12. It is preferable that the photoresist film 13 have a reversely tapered shape in which a cross section at a light shielding film 12' side thereof is smaller than a cross section at the other side. When the photoresist film 13 has the reversely tapered shape, a photoresist film for the reversely tapered shape is used. Then, as shown in FIG. 3C, a part of the light shielding film 12' is removed until a surface of the substrate 10 is exposed.

Figure 3D:
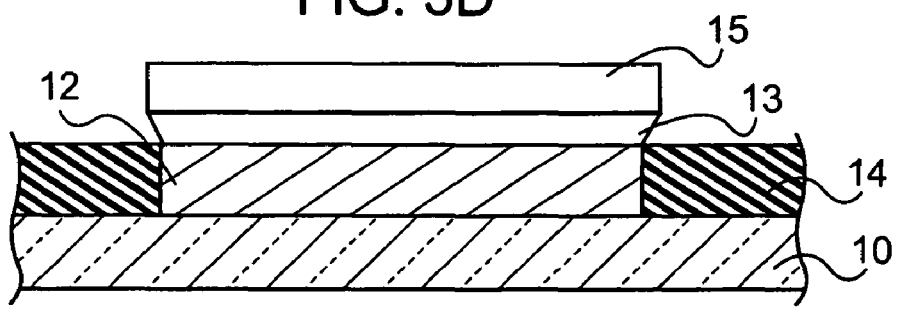
Figure 3E:
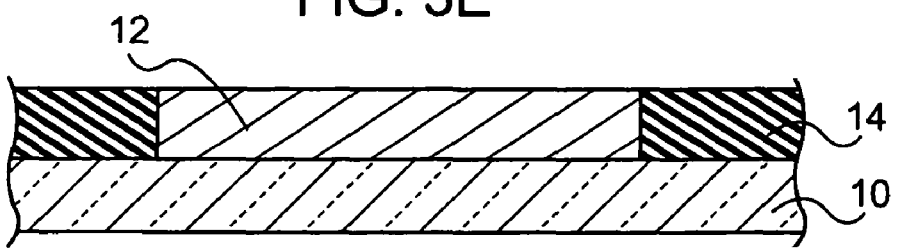

Subsequently, as shown in FIG. 3D, silicon oxide films serving as insulating films 14 and 15 are formed on the substrate 10 exposed by the etching process and the photoresist film 13, respectively. The silicon oxide films are formed by using, for example, a PECVD (plasma enhanced chemical vapor deposition) method, an LPCVD (low pressure chemical vapor deposition) method, or a physical vapor deposition method such as a sputtering method, and the thickness thereof is approximately the same as that of the light shielding film 12.

when the photoresist film 13 is peeled off, it is possible to remove the insulating film 15 formed on the photoresist film 13 and the photoresist film 13 at the same time. This is called a lift-off technology. As a result, as shown in FIG. 3E, the light shielding film 12 having an island shape, and the insulating film 14 which is provided to fill a region around the periphery of the island-shaped light shielding films and in which there is hardly step difference between the top surface of the insulating film and the surface of the light shielding film 12. When the photoresist film 13 has the reversely tapered shape, it is easy to apply the lift-off technology, because the insulating films respectively formed on the surfaces of the substrate 10 and the photoresist film are difficult to be connected each other.

When the step difference between the light shielding film 12 and the insulating film 14 is generated after removing the photoresist film due to the difference in thicknesses of the light shielding film 12 and the insulating film 14, it is possible to make the surfaces of the light shielding film 12 and the insulating film 14 flat by using an etch back method, a CMP (chemical mechanical polishing) method, or the like.

The light shielding film 12 and the insulating film 14 may be formed according to another method described below with reference to FIG. 4.

Figure 4A:
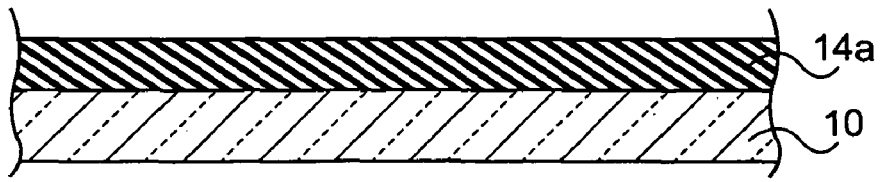
FIGS. 4A to 4E are views illustrating another method of manufacturing a semiconductor device according to the embodiment of the invention.
Figure 4B:
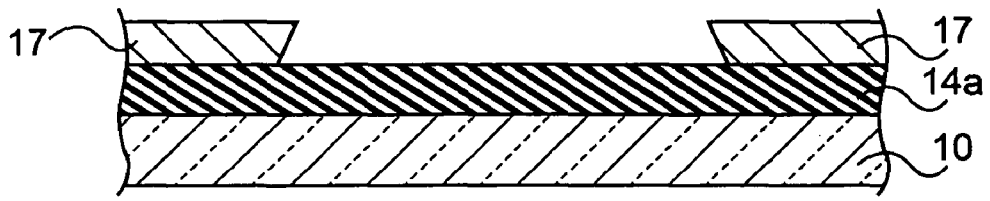
Figure 4C:
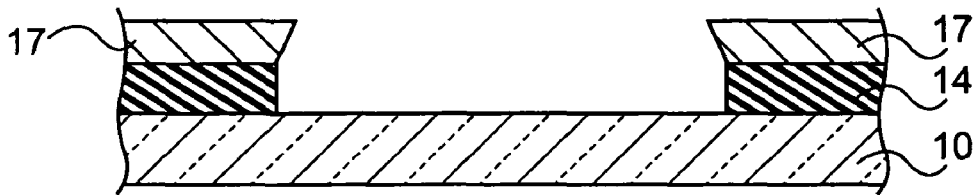

First, as shown in FIG. 4A, the surface of the substrate 10 is covered by an insulating film 14a. Then, as shown in FIG. 4B, a photoresist film 17 is formed as an etching mask having an opening in a region where a light shielding film is to be formed. Preferably, the photoresist film 17 after the opening has been formed has a reversely tapered shape in which a cross section at a substrate 10 side thereof is smaller than a cross section at the other side. When the photoresist film 17 after the opening has been formed has the reversely tapered shape, a photoresist film for the reversely tapered shape is used. Then, as shown in FIG. 4C, a part of the insulating film 14a is removed by etching using the photoresist film 17 as an etching mask.

Figure 4D:
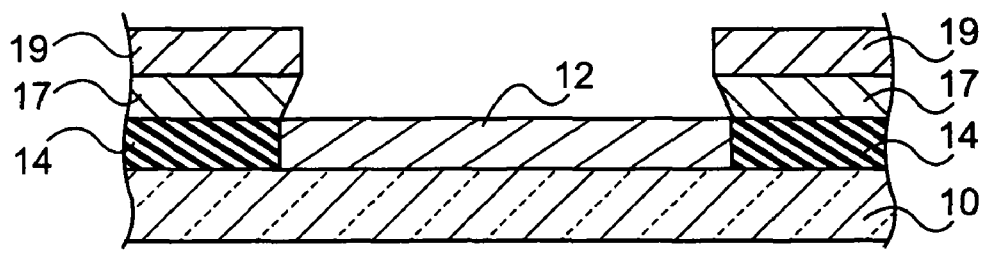
Figure 4E:
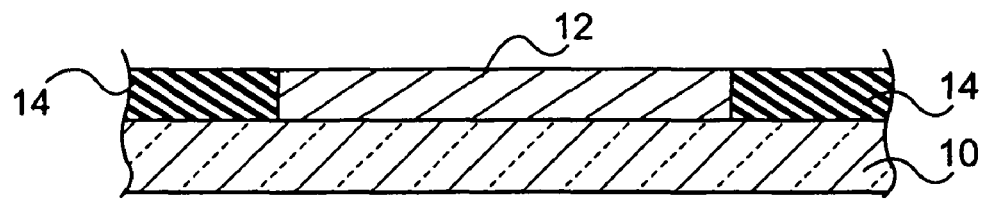

As shown in FIG. 4D, after the surface of the substrate 10 has been exposed by the etching process, light shielding films 12 and 19 are formed on the surfaces of the substrate 10 and the photoresist film 17, respectively. Finally, as shown in FIG. 4E, the photoresist film is removed, and thus the light shielding film 12 having an island shape and the insulating film 14 which is provided to fill a region around the periphery of the island-shaped light shielding films and in which there is hardly step difference between the top surface of the insulating film and the surface of the light shielding film 12. When the photoresist film 13 after the opening has been formed has the reversely tapered shape, it is easy to apply the lift-off technology, because the light shielding films 12 and 19 respectively formed on the surfaces of the substrate 10 and the photoresist film are difficult to be connected each other.

Further, the insulating film 14a may not be removed until the surface of the substrate 10 is exposed. For example, grooves are formed on the insulating film 14a, and the insulating film 14a formed with the grooves may remain on the substrate 10. In this case, preferably, the depth of each of the grooves is set such that a light shielding film is easily formed.

Formation of Semiconductor Element

Next, referring back to FIG. 1, a process of forming a semiconductor element will be described.

First, on the substrate 10 formed with the light shielding film 12 buried therein, a silicon oxide film is formed as an insulating film 16. The silicon oxide film is formed with a thickness of several hundred nanometers (nm) by using, for example, the PECVD method, the LPCVD method, or the physical vapor deposition method such as the sputtering method.

Subsequently, an amorphous silicon film is formed as a semiconductor film. Further, it is possible to improve the electric characteristics of the semiconductor element by crystallizing the amorphous silicon film. A crystallizing method may include, for example, a solid phase crystallization method or a melt crystallization method. The solid phase crystallization method is a method in which anneal is performed under an inert atmosphere at a temperature of 500° C. to 700° C. for several hours. In the solid phase crystallization method, the semiconductor film is crystallized in a solid state. However, a silicon film crystallized by the solid phase crystallization method has generally many defects. For this reason, in this invention, it is preferable to use the melt crystallization method.

Figure 7A:
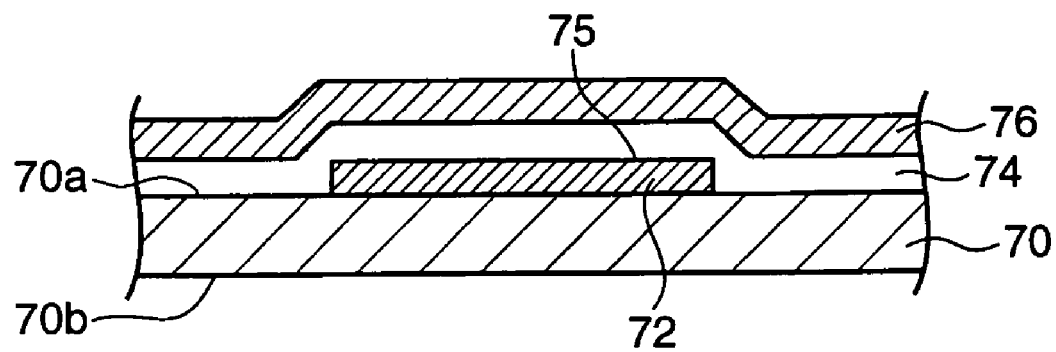
FIG. 7A is a view illustrating the related art.
Figure 7B:
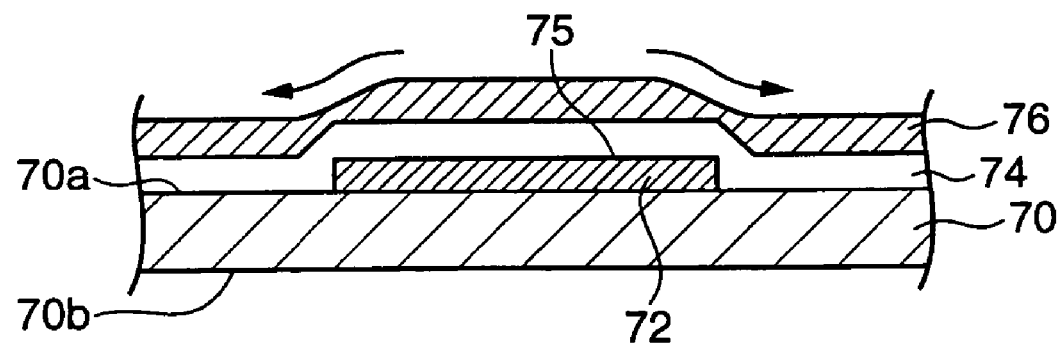
FIG. 7B is a view illustrating the related art.

The melt crystallization method is a method in which a semiconductor film is melted and solidified so as to be crystallized. As a melt crystallization method, a laser anneal method is generally used in which a semiconductor film is irradiated by a laser beam so as to be melted. As described above, according to the method of the related art in which a light shielding film is laminated on a substrate, a step difference is generated in a semiconductor film and an insulating film formed on the light shielding film 12 (see FIG. 7A). In this state, when a laser beam is irradiated onto the semiconductor film, the melted semiconductor film flows downward to be solidified. As a result, the thickness of the semiconductor film becomes different depending on the location (see FIG. 7B). Further, in the general laser anneal method, a semiconductor film is repeatedly irradiated by laser beams. When a part of the semiconductor film becomes thin in a first irradiation, it causes a second irradiation to be performed onto the semiconductor film under a condition other than the optimal condition. For this reason, the semiconductor film can be damaged occasionally. Further, when the laser irradiation condition is optimized in advance for the small thickness, a thick part is insufficiently crystallized.

In contrast, according to the method of the invention, since the insulating film 16 and the semiconductor film are formed to be substantially flat, it is possible to obtain a homogeneous and high-performance semiconductor film without being damaged.

As a laser beam to be irradiated onto a semiconductor film, a pulse laser beam is preferable, and in particular, a KrF excimer laser beam having a wavelength of about 248 nm, a XeCl excimer laser beam having a wavelength of about 308 nm, a second harmonics of a ND:YAG laser beam having a wavelength of about 532 nm and a second harmonics of a Nd:YVO$_4$ laser beam, and a fourth harmonics of a ND:YAG laser beam having a wavelength of about 266 nm and a fourth harmonics of a Nd:YVO$_4$ laser beam may be irradiated, for example, with a pulse width of 30 nsec and an energy density of 0.4 to 1.5 J/cm$^2$. When these beams are irradiated onto the semiconductor film, the semiconductor film is melted, solidified, and crystallized.

After crystallizing the semiconductor film, patterning is performed to remove a part unnecessary for the formation of TFT. In this way, it is possible to obtain a semiconductor film formed into a necessary shape.

Next, on the insulating film 16 and the semiconductor film, a silicon oxide film 18 is formed. The silicon oxide film 16 can be formed by, for example, thermal oxidation or plasma oxidation of a silicon film. When these methods are used, it is possible to lower the interface state density between the semiconductor film and the silicon oxide film, while the semiconductor film becomes thinner or the silicon oxide film cannot be formed thick due to a low oxidation rate. Also, the silicon oxide film 18 can be formed by an electron cyclotron resonance PECVD method (ECR-CVD method), the LPCVD method, or the PECVD method. When the silicon oxide film 18 is formed by a CVD method after performing thermal oxidation or plasma oxidation, it is possible to lower the interface state density between the semiconductor film and the silicon oxide film 18 and to form the silicon oxide film having a desired thickness. The silicon oxide film 18 functions as a gate insulating film of a TFT. Since the semiconductor film is flat, the silicon oxide film 16, serving as a gate insulating film, formed on the semiconductor film, is also flat. Therefore, it is possible to form an flat gate insulating film regardless of the presence of the light shielding film.

Subsequently, on the silicon oxide film 18, a thin metallic film made of Ta or Al is formed by a sputtering method and then patterned so as to form a gate electrode 18. When the highest process temperature after forming the gate electrode is about 1000° C., a metallic film can not be used as the gate electrode. In such a case the gate electrode is composed of a polycrystalline silicon film into which impurity ions are implanted. Since the semiconductor film and the gate insulating film are flat, the gate electrode 18 formed thereon is also flat. Therefore, it is possible to form the gate electrode to be flat regardless of the presence of the light shielding film.

Then, the impurity ions, which become donors or acceptors, are implanted by using the gate electrode 18 as a mask such that a source/drain region 20 and a channel forming region 21 are self-aligned with respect to the gate electrode 18. In a case of manufacturing an NMOS transistor, for example, phosphorous elements serving as impurity elements are implanted into the source/drain region 30 in a concentration of $1 \times 10^{16}$ cm$^{-2}$. Then, the impurity elements are activated by irradiating a XeCl excimer laser beam with an irradiation energy density of about 400 mJ/cm$^2$ or by performing a thermal process at a temperature of 250° C. to 1000° C.

Thereafter, on top surfaces of the silicon oxide film 16 and the gate electrode 20, a silicon oxide film 24 is formed. The silicon oxide film 24 can be formed to have a thickness of, for example, about 500 nm, by using the PECVD method. Then, contact holes reaching the source/drain region 22 are formed in the silicon oxide films 18 and 24, and source/drain electrodes 26 are formed in the contact holes and in the peripheries of the contact holes on the silicon oxide film 24. The source/drain electrodes 26 may be formed, for example, by depositing Al by a sputtering method. Further, a contact hole reaching the gate electrode 20 is formed in the silicon oxide film 24, and a terminal electrode (not shown) for the gate electrode 18 is formed. As described above, a TFT 1, serving as a semiconductor element according to the invention, is formed.

Liquid Crystal Device

Figure 5:
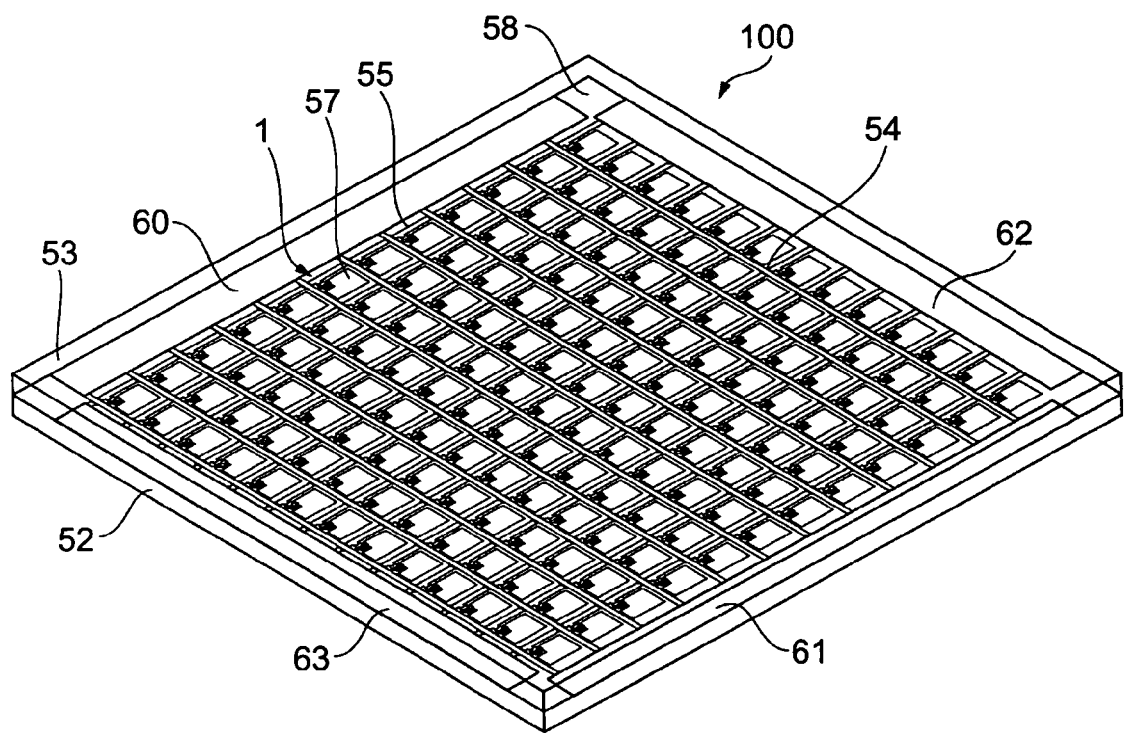
FIG. 5 is a view illustrating the connection relationships in a liquid crystal device according to the embodiment of the invention.

FIG. 5 shows a liquid crystal display device 100 as an example of a liquid crystal device according to the invention.

As shown in FIG. 5, the liquid crystal display device 100 includes an element substrate 52 formed with the TFTs 1, a counter substrate 53 opposite to the element substrate 52, and a liquid crystal layer (not shown) composed of liquid crystal, having positive dielectric anisotropy, interposed between the element substrate (active-matrix substrate) 52 and the counter substrate 53.

The TFTs 1 are formed on the substrate 52 in an island shape, and a light shielding film, which has an island shape and covers a semiconductor film corresponding to each of the TFTs 1, is formed to prevent light from being incident on the semiconductor film.

The liquid crystal display device 100 includes a display pixel region in which pixel circuits having a plurality of source lines (data lines) 54 and a plurality of gate lines (scanning lines) 55 intersecting with each other are formed; and a driving circuit region in which driving circuits for supplying driving signals to the source lines 54 and the gate lines 55 are formed.

At each of the intersections between the source lines 54 and the gate line 55 disposed on the inner surface side of the element substrate 52, the TFT 1 is formed to perform a switching operation on a corresponding pixel electrode 57 (load). In other words, at each of the pixels arranged in a matrix, one TFT 1 and one pixel electrode 57 are provided. Further, on the entire inner surface of the counter substrate 53, one common electrode 58 is formed over the entire display pixel region in which a plurality of pixels are arranged in a matrix.

Meanwhile, driving circuits (source drivers) 60 and 61 that control the drive of the pixels connected to the TFTs 1 are formed on the inner surface side of the element substrate 52 in the same manner as the TFTs 1, and have a plurality of TFTs (not shown). The driving circuits 60 and 61 are supplied with control signals from a control circuit (not shown) and generate driving signals (data signals) for driving the TFTs 1 on the basis of the control signals. Further, in the same manner as the driving circuits 60 and 61, driving circuits 62 and 63 that control the drive of the pixels connected to the TFTs 1 have a plurality of TFTs and generate driving signals (scanning signals) for driving the TFTs 1 on the basis of the control signals supplied thereto.

Electronic Apparatus

FIGS. 6A to 6F show examples of an electronic apparatus according to the invention. The electronic apparatus according to the invention includes an active-matrix substrate, which is a semiconductor device according to the invention obtained by forming TFTs in the above-mentioned manner.

Figure 6A:
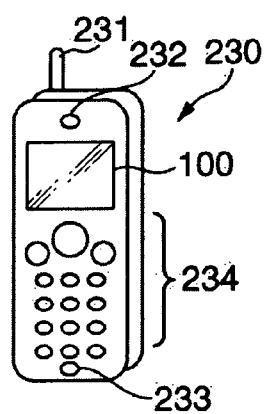
FIG. 6A is a view illustrating a mobile phone as an example of an electronic apparatus according to the embodiment of the invention.
Figure 6B:
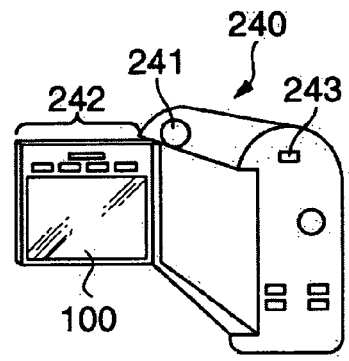
FIG. 6B is a view illustrating a video camera as another example of the electronic apparatus according to the embodiment of the invention.

FIG. 6A shows an example of a mobile phone provided with a semiconductor device manufactured by the method according to the invention. The mobile phone 230 has a liquid crystal display device (display panel) 100, an antenna 231, a voice output portion 232, a voice input portion 233, and an operation portion 234. The method of manufacturing the semiconductor device according to the invention may be applied to a method of manufacturing the display panel 100, a method of manufacturing a semiconductor device provided for a built-in integrated circuit, etc. FIG. 6B shows an example of a video camera, which has a semiconductor device manufactured by the method according to the invention. The video camera 240 has an electro-optical device (display panel) 100, an image receiver 241, an operation portion 242, and a voice input portion 243. The method of manufacturing the semiconductor device according to the invention may be applied to the method of manufacturing the display panel 100, the method of manufacturing the semiconductor device provided for a built-in integrated circuit, etc.

Figure 6C:
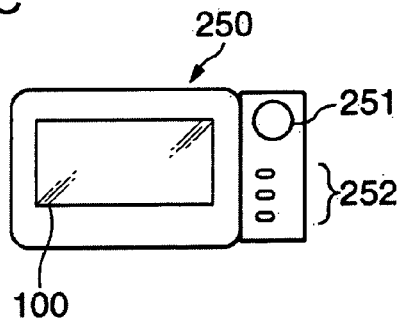
FIG. 6C is a view illustrating a portable personal computer as anther example of the electronic apparatus according to the embodiment of the invention.
Figure 6D:
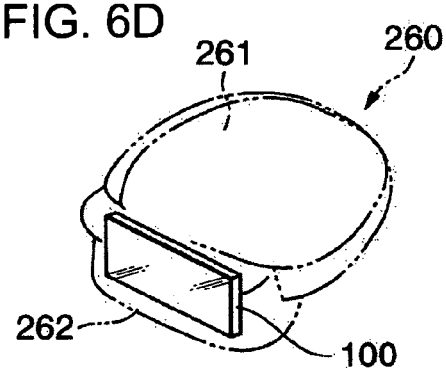
FIG. 6D is a view illustrating a head-mounted display as another example of the electronic apparatus according to the embodiment of the invention.

FIG. 6C shows an example of a portable personal computer provided with a semiconductor device manufactured by the method according to the invention. The computer 250 has an electro-optical device (display panel) 100, a camera unit 251, and an operation portion 252. The method of manufacturing the semiconductor device according to the invention may be applied to the method of manufacturing the display panel 100, the method of manufacturing a semiconductor device provided for a built-in integrated circuit, etc. FIG. 6D shows an example of a head-mounted display having a semiconductor device manufactured by the method according to the invention. The head-mounted display 260 has an electro-optical device (display panel) 100, head unit 261, and an optical recess 262. The method of manufacturing the semiconductor device according to the invention may be applied to the method of manufacturing the display panel 100, the method of manufacturing a semiconductor device provided for a built-in integrated circuit, etc.

Figure 6E:
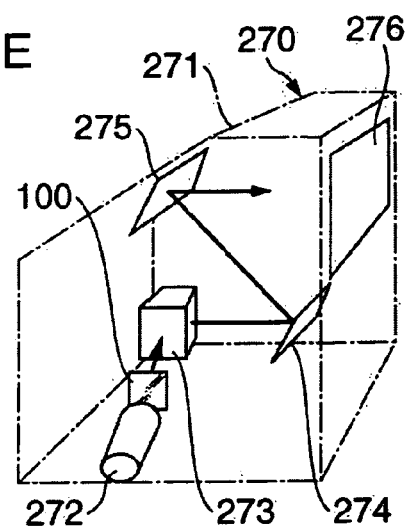
FIG. 6E is a view illustrating a rear projector as an example of the electronic apparatus according to the embodiment of the invention.
Figure 6F:
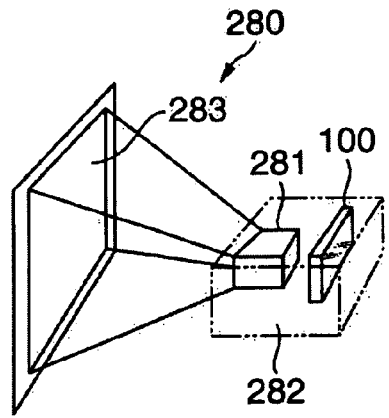
FIG. 6F is a view illustrating a front projector as an example of the electronic apparatus according to the embodiment of the invention.

FIG. 6E shows an example of a rear projector having a semiconductor device manufactured by the method according to the invention. The projector 270 has an electro-optical device (optical modulator) 100, a light source 272, an optical synthesizing system 273, and mirrors 274 and 275 in a casing 271. The method of manufacturing the semiconductor device according to the invention may be applied to the method of manufacturing the optical modulator 100, the method of manufacturing a semiconductor element provided for a built-in integrated circuit, etc. FIG. 6F shows an example of a front projector having a semiconductor device manufactured by the method according to the invention. The projector 280 has an electro-optical device (image display source) 100 and an optical system 281 in a casing 282 and can display images on a screen 283. The method of manufacturing the semiconductor device according to the invention may be applied to the method of manufacturing the image display source 100, the manufacturing method of a semiconductor element provided for a built-in integrated circuit.

The method of manufacturing the semiconductor element according to the invention is not limited to the above-mentioned examples, but can be applied to any methods of manufacturing various electronic apparatuses. For example, the manufacturing method can be applied to a fax machine having a display function, a finder of a digital camera, a portable TV, a DSP device, a PDA, an electronic organizer, an electronic billboard, a display for advertising, an IC card, etc.

Further, the invention is not limited to the above-mentioned embodiments but can be changed or modified in the scope of the invention. For example, in the above-mentioned embodiments, a silicon film is used as the semiconductor film but it is not limited thereto. Furthermore, in the above-mentioned embodiments, as a semiconductor device, an active-matrix substrate is used which has a TFT (semiconductor element) but the semiconductor device is not limited thereto. The semiconductor device may have other elements (for example, a thin film diode). Besides, in the above-mentioned embodiment, as the TFT, a top-gate TFT is used, but a bottom gate TFT can be used.

The entire disclosure of Japanese Patent Application No. 2005-014510, filed Jan. 21, 2005 is expressly incorporated by reference herein.

What is claimed is:

1. A semiconductor device comprising:
   a substrate;
   a semiconductor element including a semiconductor film, the semiconductor film having a source region, a channel region and a drain region;
   an island-shaped light shielding film disposed between the semiconductor film and the substrate, the island-shaped light shielding film having an outer edge between the channel region and an outer edge of the source region and another outer edge between the channel region and an outer edge of the drain region, the area of the island-shaped light shielding film being slightly larger than the area of the channel region and being not larger than the area of the semiconductor film;

a first insulating film around the periphery of the island-shaped light shielding film, the first insulating film being in a non-overlapping condition with the island-shaped light shielding film; and a second insulating film formed on the first insulating film and the island-shaped light shielding film.

2. The semiconductor device according to claim 1, wherein the first insulating film is in contact with the substrate.

3. The semiconductor device according to claim 1, wherein the island-shaped light shielding film absorbs or reflects at least a part of light that is incident on the semiconductor film through the substrate.

4. The semiconductor device according to claim 1, wherein the island-shaped light shielding film is formed so as to cover at least a channel forming region of the semiconductor film.

5. A liquid crystal device comprising the semiconductor device according to claim 1.

6. An electronic apparatus comprising the semiconductor device according to claim 1.

7. The semiconductor device according to claim 1, wherein the island-shaped light shielding film has a surface facing toward the semiconductor film and away from the substrate; and the first insulating film around the periphery of the island-shaped light shielding film has a surface that is level with the surface of the island-shaped light shielding film.

* * * * *